United States Patent [19]

Rothenberger

[11] Patent Number: 5,895,281
[45] Date of Patent: Apr. 20, 1999

[54] HIGH DENSITY BOARD TO BOARD CONNECTOR

[75] Inventor: Richard Ellis Rothenberger, Bainbridge, Pa.

[73] Assignee: The Whitaker Corporation, Wilmington, Del.

[21] Appl. No.: 08/918,116

[22] Filed: Aug. 27, 1997

[51] Int. Cl.[6] .................................................. H01R 13/62
[52] U.S. Cl. ................................................ 439/326; 439/83
[58] Field of Search .............................. 439/55, 326, 327, 439/328, 69, 74, 83

[56] References Cited

U.S. PATENT DOCUMENTS

| | | | |
|---|---|---|---|
| 4,718,859 | 1/1988 | Gardner | 439/326 X |
| 5,425,651 | 6/1995 | Thrush et al. | 439/326 |
| 5,491,303 | 2/1996 | Weiss | 439/83 X |
| 5,746,608 | 5/1998 | Taylor | 439/73 |

*Primary Examiner*—Khiem Nguyen

[57] ABSTRACT

The invention is directed to an electrical connector comprising a housing having a plurality of contacts mounted therein to provide electrical connection from a daughter board to a circuit board. The contacts provide a linear array of first connection points to the circuit board. The circuit board converts the linear array of first connection points to an area array of second connection points and the area array of second connection points are connected to a mother board by way of a ball grid array. The housing provides an electrical connection between the daughter board and the mother board.

18 Claims, 7 Drawing Sheets

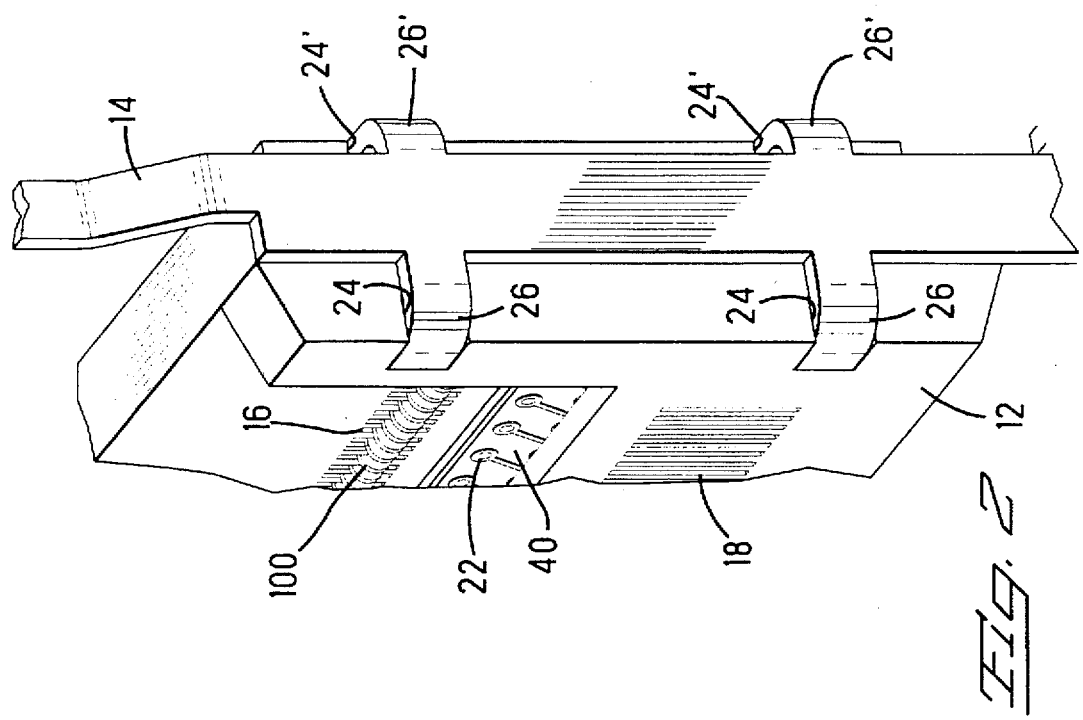
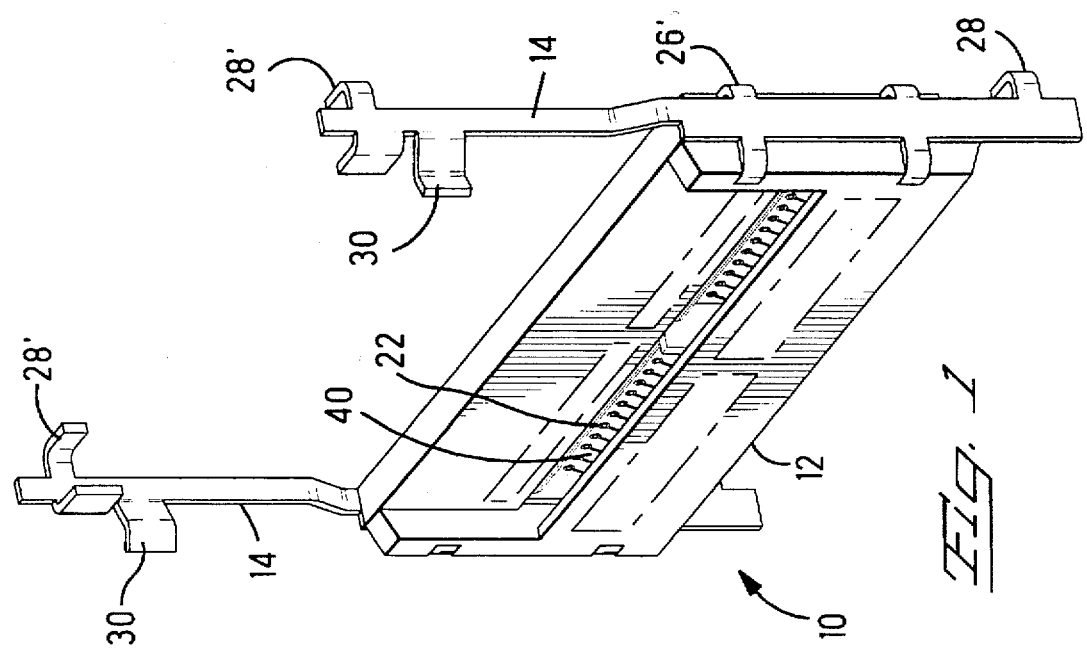

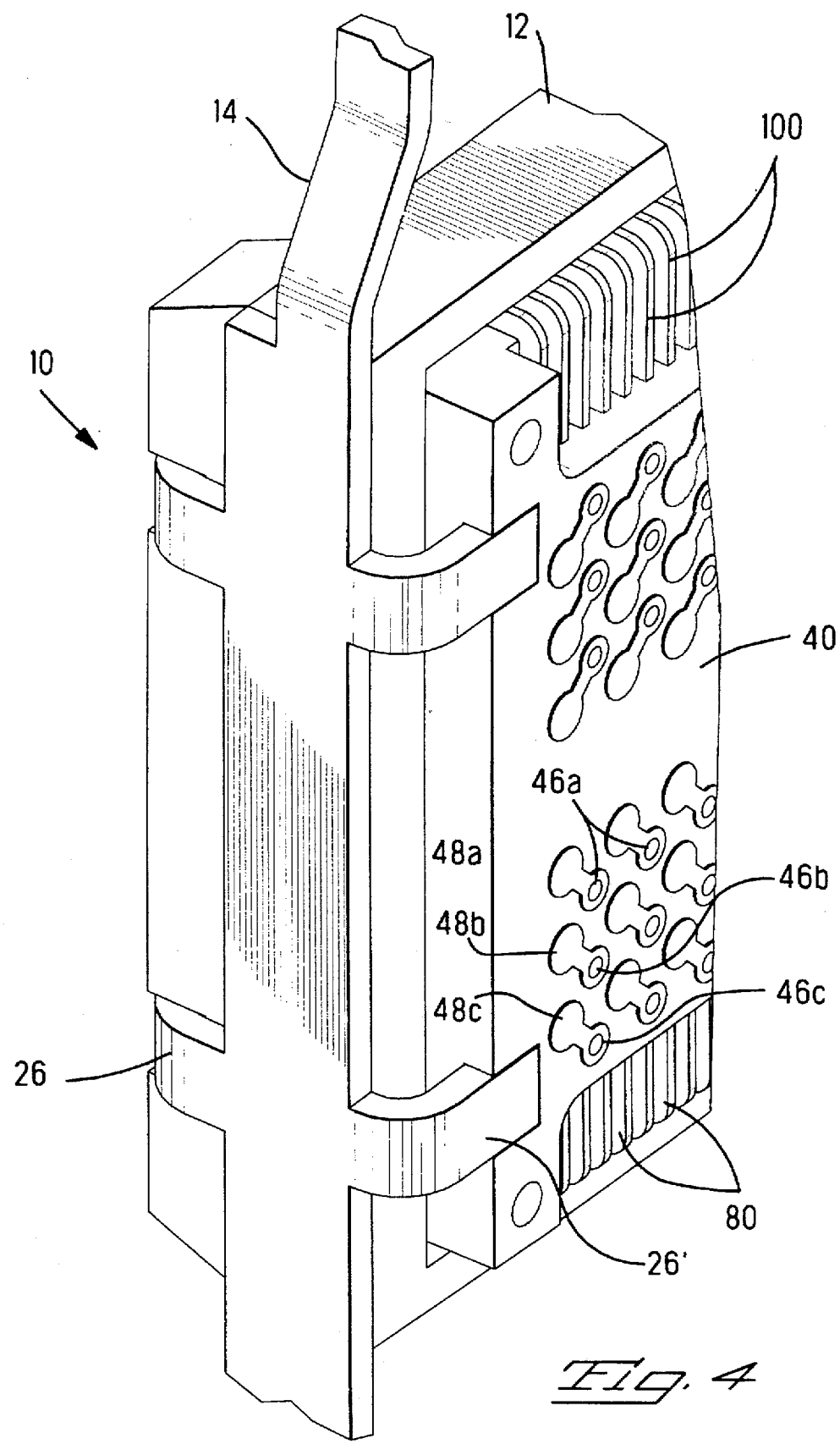

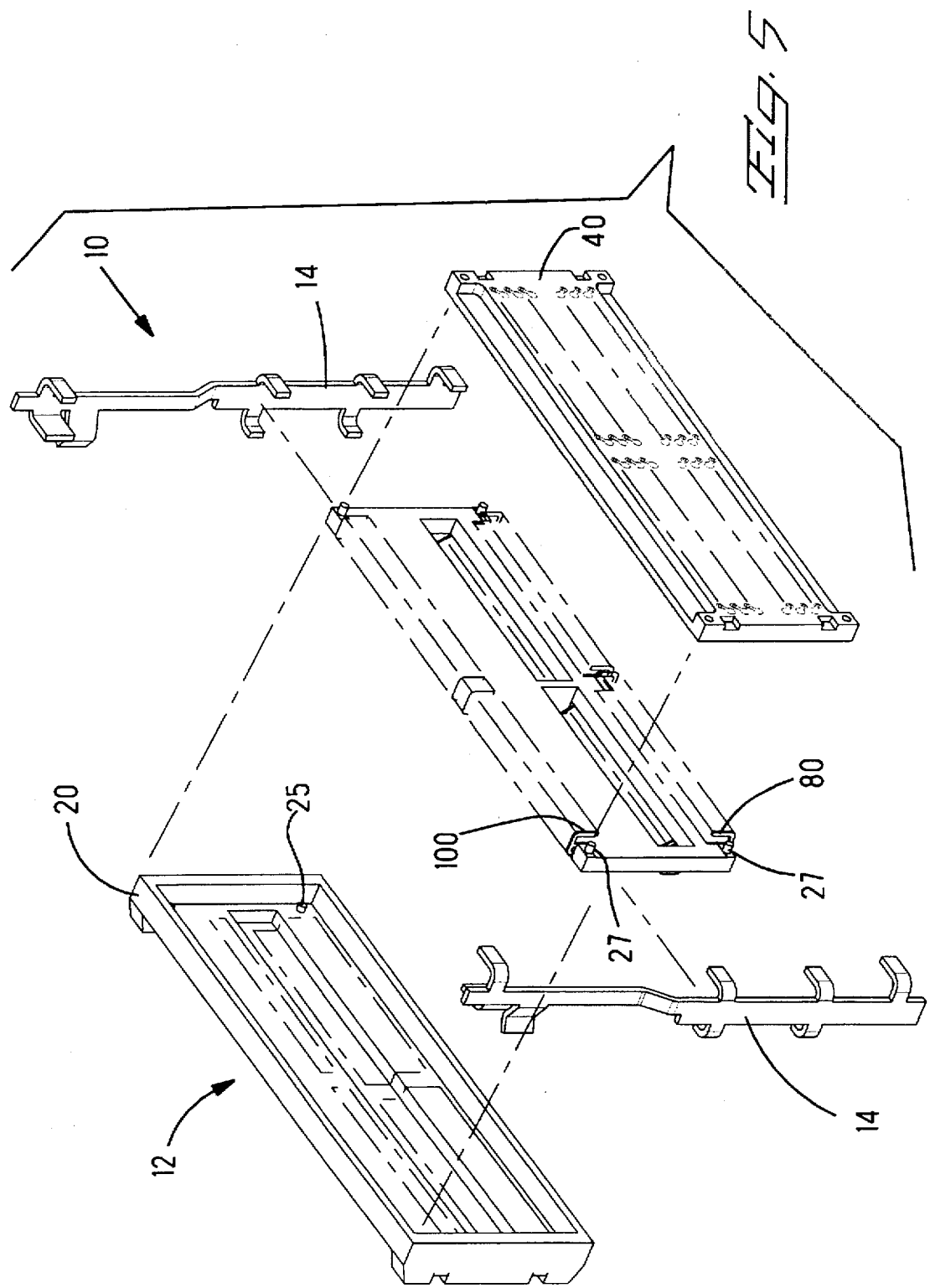

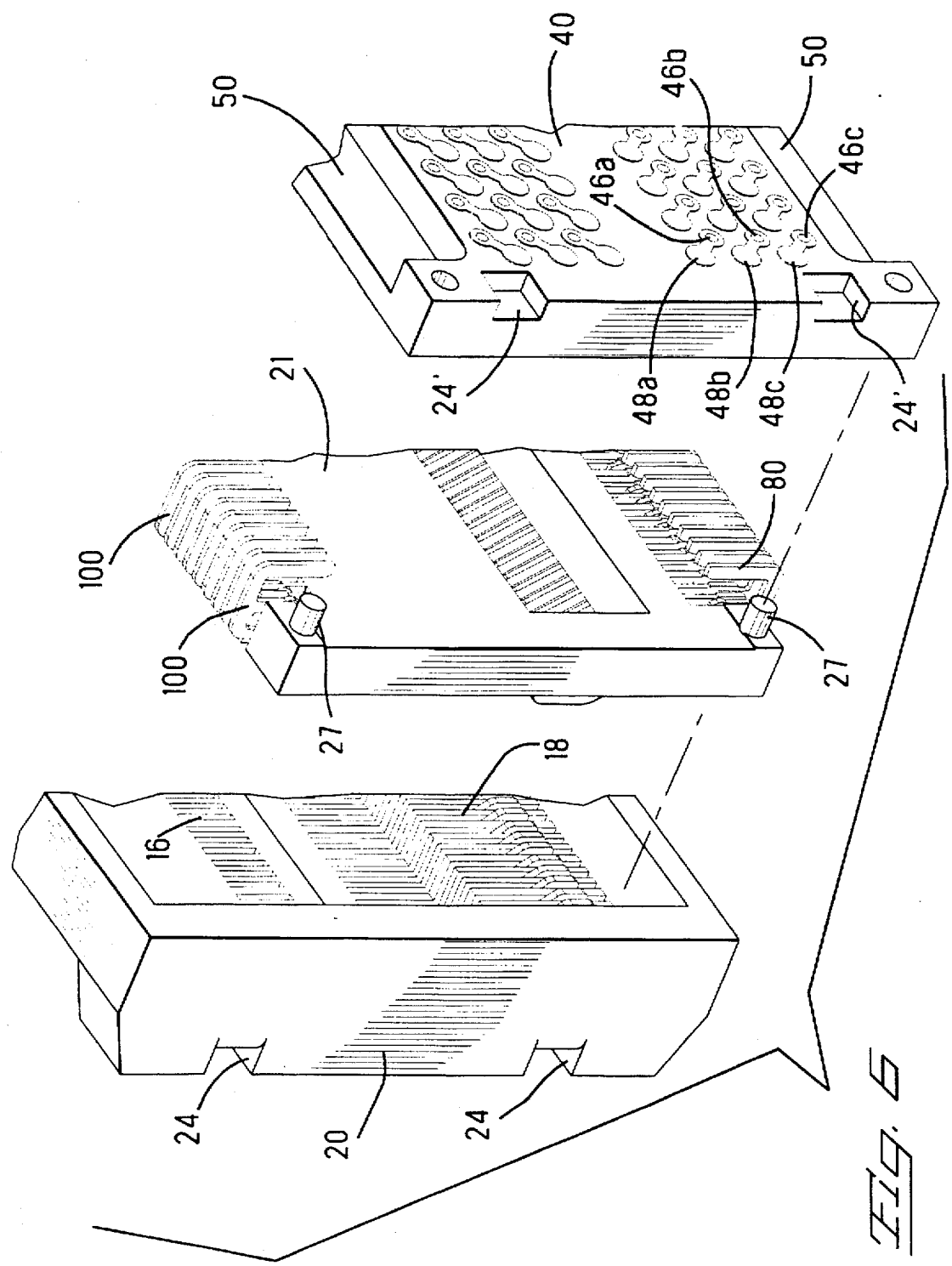

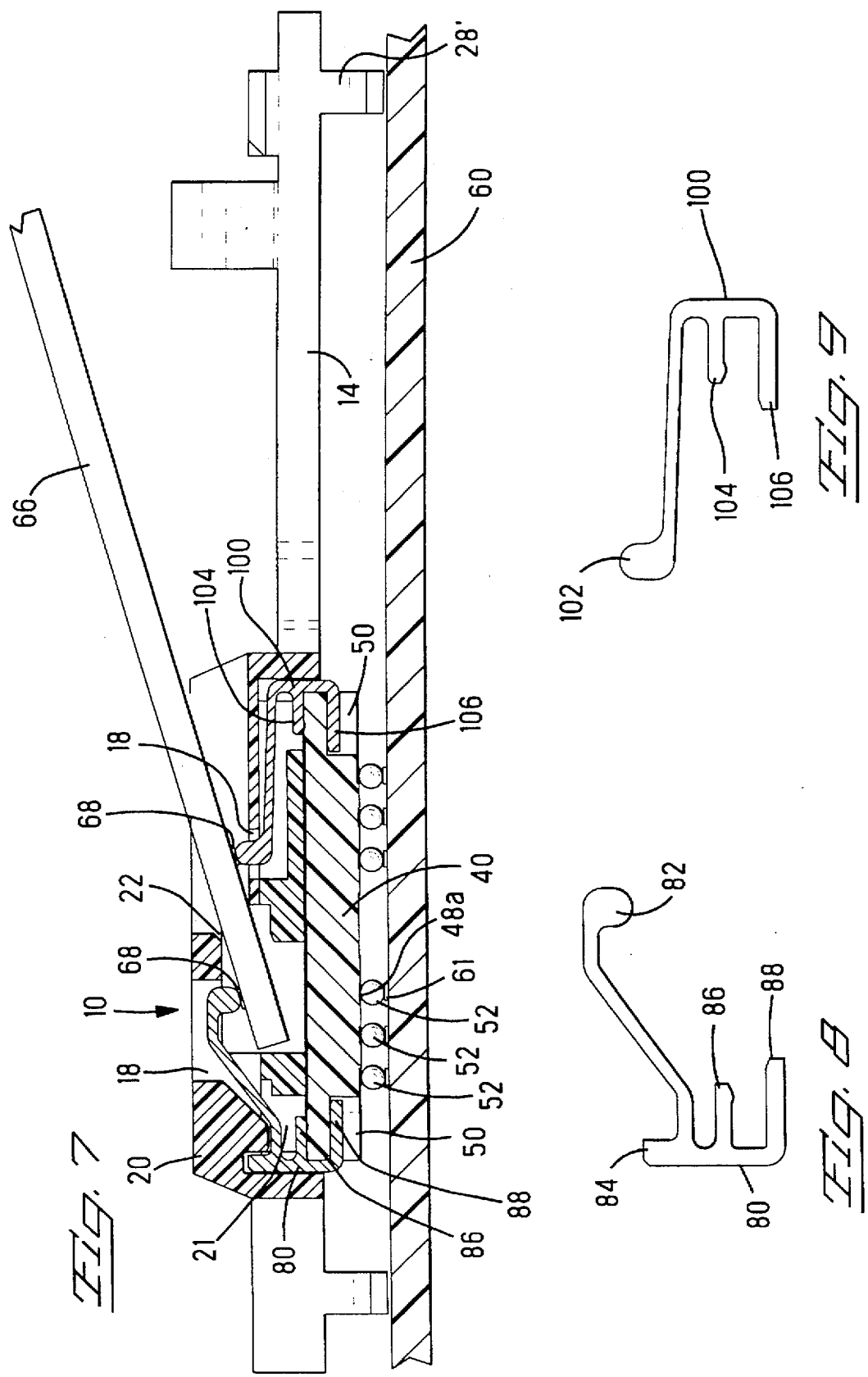

HIGH DENSITY BOARD TO BOARD CONNECTOR

FIELD OF THE INVENTION

The invention is directed towards a connector to provide a high density connection from one board to another board while maintaining reliable soldered connections to the motherboard.

BACKGROUND OF THE INVENTION

There are many electrical connectors which provide connection from one circuit board, such as a daughter board, to another circuit, such as a mother board. Typically, the electrical connector is mounted permanently to the mother board so that the daughter board can be removably connected to the mother board. The electrical connector typically has a separable connection to the daughter board wherein contacts engage contact pads on the daughter board when it is inserted into the electrical connector. One arrangement is to have the electrical connector mounted along the mother board with latching arms extending therefrom so that the daughter board can be mounted to the mother board in the parallel fashion. Often the daughter board has contact pads along both surfaces of the daughter board. Therefore, the electrical connector must make electrical connections on both sides of the daughter board.

What is needed is an electrical connector which can provide a high density of electrical connections between the mother board and the daughter board.

SUMMARY OF THE INVENTION

The invention is directed to an electrical connector comprising a housing having a plurality of contacts mounted therein to provide electrical connection from a daughter board to a circuit board. The contacts provide a linear array of first connection points to the circuit board. The circuit board converts the linear array of first connection points to an area array of second connection points and the area array of second connection points are connected to a mother board by way of a ball grid array. The housing provides an electrical connection between the daughter board and the mother board.

The invention is further directed to an electrical connector comprising a housing having a linear array of electrical contacts disposed therein. The contacts each have first contact sections to provide electrical connection to a daughter board and second contact sections to provide electrical connection to a circuit board. The second contact sections are disposed in a linear array on the circuit board. The circuit board has traces to convert the linear array to an area array of connection sections. The area array of connection sections is electrically connected to a mother board by way of a ball grid array.

BRIEF DESCRIPTION OF THE DRAWINGS

An embodiment of the present invention will now be described with reference to the accompanying drawings, in which:

FIG. 1 is an isometric view of the electrical connector of the present invention;

FIG. 2 is an enlarged view of FIG. 1;

FIG. 4 is an enlarged view of FIG. 3;

FIG. 5 is an exploded isometric view of the electrical connector;

FIG. 6 is an enlarged view of FIG. 5;

FIG. 7 is a cross-sectional view of the electrical connector showing the contacts therein and the circuit board;

FIG. 8 is a side view of one of the contacts;

FIG. 9 is a side view of the other of the contacts;

DETAILED DESCRIPTION OF AN EMBODIMENT OF THE INVENTION

Figure 3:
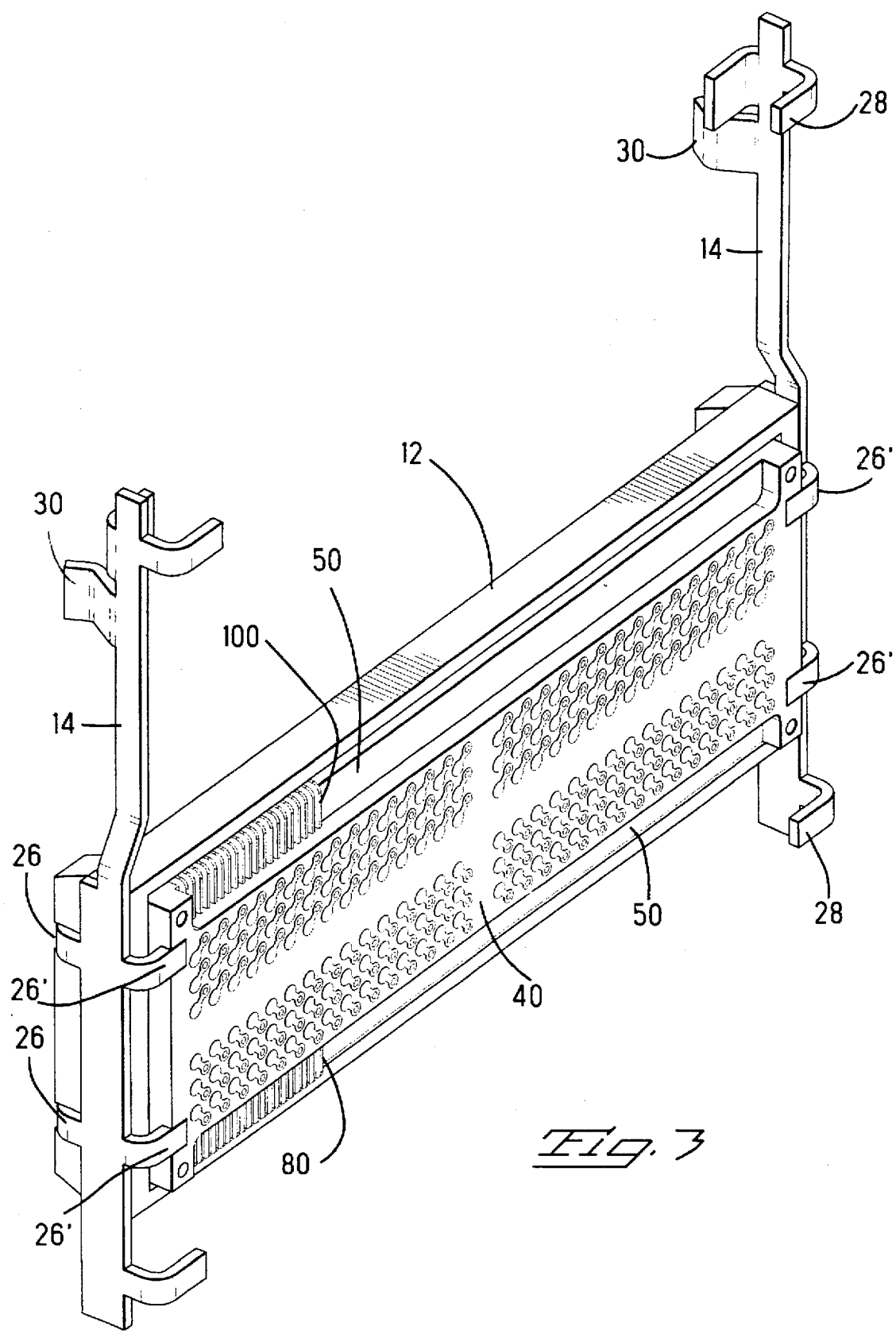
FIG. 3 is an isometric view of the bottom of the electrical connector.

The particular embodiment of the electrical connector shown in the drawings is an electrical connector to connect a dual in-line memory module (DIMM) circuit board with a mother board. However, it is understood that the present invention could be used to connect other types of circuit boards to a mother board.

The present invention is directed towards an electrical connector 10 having a main body 12 with two members 14 extending along either side of the main body 12, see FIGS. 1 and 2. The main body 12 is a plastic housing member having a plurality of slots 16, 18 into which contacts 80, 100 will be mounted. The main body member 12 also comprises a printed circuit board 40 mounted along a bottom portion thereof. A board mounting slot 22 extends along the upper surface of the main body 12 to receive the daughter board therein. The board mounting slot 22 extends between the slots 16, 18 in the main body member 12.

Along either side of the main housing 12 are mounting members 14. The mounting members 14 are typically made of metal, but they can also be made from a plastic material, depending on the use for the connector. The mounting members 14 are used as both a latch to secure a daughter board 66 within the electrical connector 10 and also a mounting and stabilizing member to stabilize the electrical connector 10 to the mother board 60, see FIG. 7. The mounting members 14 each have latching fingers 26, 26' which are received into recesses 24, 24' along the main housing 12. These latching fingers 26, 26' will secure the members 14 to the main housing 12 and secure the main body 12 together. The mounting members 14 each also have two surface mount stabilizing pads 28, 28'. Each surface mount pad 28, 28' will be secured to the mother board 60 to both secure the connector 10 thereto and stabilize the connector 10. Each of the mounting members 14 also have a latch member 30 which will latch onto the daughter board 66 and secure the daughter board 66 to the electrical connector 10, see FIG. 7.

The bottom view of the electrical connector 10, shown in FIG. 3 and 4, shows the printed circuit board 40 mounted along the bottom of the electrical connector 10. As can be seen from this view, the latching fingers 26' are wrapped around the bottom of the electrical connector 10 thereby securing the printed circuit board 40 and the main body 12 together. The printed circuit board 40 has a series of surface mount pads 48 which are connected to vias. Further, the contacts 80, 100 are secured within the main body 12 and are wrapped around the printed circuit board 40, within recess 50, to secure the contacts 80, 100 within the electrical connector 10.

FIGS. 5 and 6 show an exploded view of the electrical connector 10. The main body 12 is made from three parts, a top portion 20 having the slots 16 and 18, a middle portion 21 showing the contacts 80, 100 mounted thereon, and the printed circuit board 40 received along the bottom of the main body 12. The middle portion 21 is a comb structure to provide the proper alignment and spacing for the contacts 80, 100. The top portion 20 has a recess 23 into which the middle portion 21 is received and secured. Alignment stakes 25 are received within recesses, not shown, on the middle portion 21 to align the middle portion 21 and the contacts 80, 100 with the top portion 20. Middle portion 21 has alignment stakes 27 which are received within recesses in the printed circuit board 40, not shown, to align the middle portion 21 and the contacts 80, 100 with the printed circuit board 40.

FIG. 7 shows a cross-sectional view of the main body 12. From this view, it can be seen that the middle portion 21 is mounted within the top portion 20 and the circuit board 40 is mounted to the bottom of the middle portion 21. The contacts 80, 100 are secured within the middle portion 21 and to the circuit board 40 and extend through slots 16, 18 in the top portion 20.

The electrical connector 10 is shown mounted to the mother board 60. The surface mount stabilizer pads 28, 28' secure the electrical connector 10 to the mother board 60. The surface mount stabilizer pads 28, 28' are either soldered to the mother board 60 or secured to the mother board 60 in some other manner.

FIGS. 7, 8 and 9 show the two different contacts 80, 100 which are secured within the electrical connector 10. Contact 80 has a connection section 82 a stabilizing finger 84 a contact pad 86 and a second stabilizing tab 88. Contact 100 has contacting section 102 contact pad 104 and stabilizing finger 106.

Contacts 80, 100 are mounted within the main housing 12 and provide surface compressive contacts to the printed circuit board 40. Contacts 80, 100 have surface mount contact pads 86, 104 to provide electrical connection to contact pads 42 on the printed circuit board 40. The contacts 80, 100 also have securing pads 88, 106 which are received around the bottom of the circuit board, within the recess 50, to secure the contacts 80, 100 to the circuit board 40.

The connector 10 is assembled by first mounting the contacts 80, 100 to the circuit board 40. The contacts 80, 100 are secured onto the circuit board 40 because they are clipped onto the circuit board 40. When the contacts 80, 100 are mounted onto the circuit board 40, contact pads 86, 104 and the stabilizing tabs 88, 106 are deflected away from each other. Therefore, they apply a compressive force on the circuit board 40 to secure the contacts 40, 100 onto the circuit board 40. The middle portion 21 is mounted onto the circuit board 40 to provide spacing and alignment of the contacts. The circuit board 40 and the middle portion are then assembled to the rest of the connector 10.

FIG. 7 shows the board receiving slot 22 within the electrical connector 10 between the contacts 80 and 100. The slot 22 is designed such that the daughter board 66 is inserted within the slot 22 at an angle. After insertion, the daughter board 66 is rotated into a position parallel to the mother board 60 and the contacts 80, 100 then are received against traces on the daughter board 66.

Figure 10:
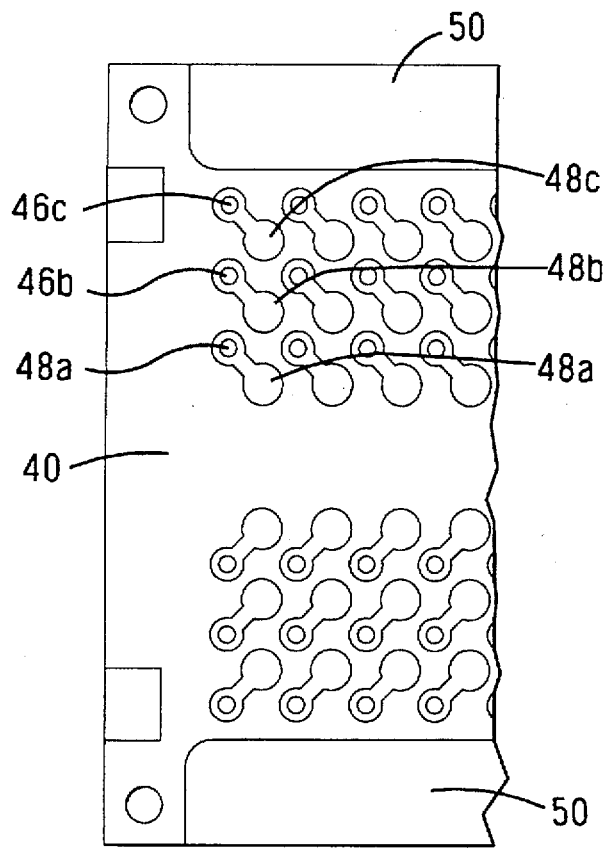
FIG. 10 is a bottom view of the circuit board.
Figure 11:
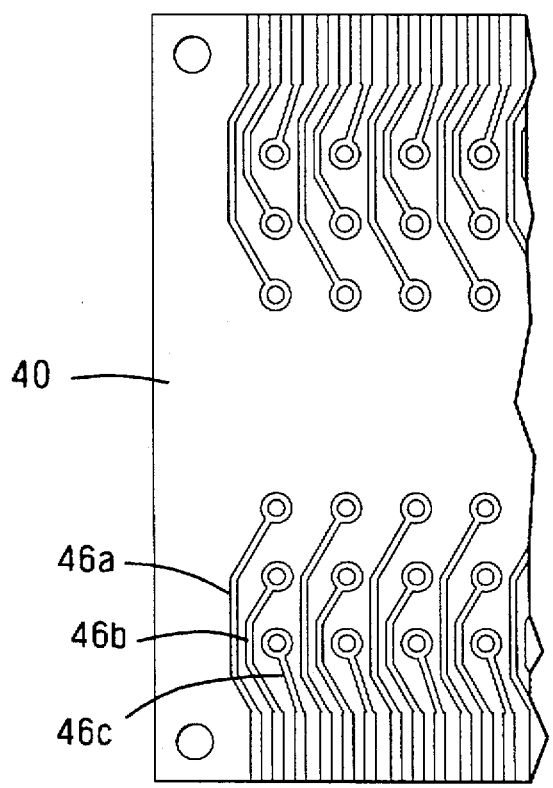
FIG. 11 is a top view of the circuit board.

FIG. 11 shows a top portion of the printed circuit board 40. The printed circuit board 40 has contact pads 42 which are disposed along the edge of the printed circuit board 40. The surface mount pads 42 are very close together in order to provide a large number of connection points to the daughter board 66. Extending from each of the contact pads 42 are traces 44a, 44b, 44c, each leading to vias 46a, 46b, and 46c. The vias extend from the top of the circuit board 40 down to the bottom of the printed circuit board 40 as shown in FIG. 10. Each of the vias 46a, 46b, 46c is connected to a dog bone structure on the bottom of the circuit board 40. Each of the dog bone structures has a round contact pad 48a, 48b, 48c. These round contact pads are aligned in an array both vertically and horizontally with each other. The bottom of the circuit board 40 has recesses 50 which receives the securing tabs 88, 106 of the contacts 80, 100. The contacts 80, 100 are mounted to the printed circuit board 40 along each edge to provide a high density interconnection to the printed circuit board 40 in a linear array along each edge of the printed circuit board 40. Use of traces 44, vias 46,and finally the round circuit pads 48a, 48b, and 48c converts the linear array along the top of the circuit board 40 into an area array of circuit pads along the bottom of the circuit board 40.

Each of the round circuit pads 48a, 48b, 48c receive a round solder ball 52 to provide electrical connection between the circuit board 40 and the mother board 60. The solder balls 52 are then mounted onto individual pads 61 on the mother board 60.

The daughter board 66 has contact pads 68 disposed along both sides of the daughter board, see FIG. 7. The daughter board 66 is inserted into the board receiving slot 22 in the electrical connector 10 at an angle. The daughter board 66 is then rotated down to its lower position with the mother board 60 having the latch 30 latched over the edge of the daughter board 66 thereby securing it within the electrical connector 10. Once completely installed, the contacts 80 provide electrical contact to circuit pads 68 on top of the mother board 66 and contacts 100 provide electric connection to circuit pads 68 on the bottom on the daughter board. The contacts 80, 100 are disposed in a linear array along the electrical connector. This provides a plurality of connection points to the daughter board 66. The contacts 80, 100 then provides electrical connection to the printed circuit board 40 in a linear array along the edge of the printed circuit board 40. The circuit traces on the circuit board 40 then serve to reconfigure the electrical connection from the linear array to a horizontal and vertical array, or area array, along the bottom of the printed circuit board 40 on which solder balls 52 are mounted. These solder balls 52 will then provide electrical connection to circuit pads on the metal board 60.

The solder balls are typically 90-10 Pb/Sn solder balls. Alternatively, they can be eutectic solder balls, 63/37 ratio.

The solder balls are secured to the contact pads 48a, 48b, 48c, and 61 by soldering. If the 90-10 solder balls are used, a eutectic solder is used to secure the solder balls to the contact pads. Since 90-10 solder balls have a higher melting temperature than eutectic solder, the eutectic solder can be heated and flowed without disrupting the 90-10 solder balls. Alternatively, if the 63/37 eutectic solder balls are used, they can be secured to the contact pads without additional solder. The eutectic solder balls are heated enough to allow the solder to flow to a certain extent, while still maintaining their basic ball shape. This method allows the eutectic solder balls to act as their own source of solder.

An advantage of the embodiment of the present invention is that a peripheral linear array of electrical connection is converted to an area array of electrical connection which can use solder balls to provide the electrical contact to the mother board. This allows for a higher spacing of the electrical connection along the periphery of the printed circuit board because the final connection is made in the array.

The electrical connector of the present invention and many of its attended advantages will be understood from the foregoing description. It is apparent that various changes may be made in the form, construction, and arrangement of parts thereof without departing from the spirit or scope of the invention, or sacrificing all of its material advantages.

What is claimed is:

1. An electrical connector for providing electrical connection from a daughter board to a mother board, comprising:

a housing having a plurality of contacts mounted therein to provide electrical connection from the daughter board to a circuit board, the contacts providing a linear array of first connection points to the circuit board;

the circuit board converts the linear array of first connection points to an area array of second connection points and the area array of second connection points are connected to the mother board by way of a ball grid array.

2. The electrical connector of claim 1, wherein the ball grid array comprises solder balls.

3. The electrical connector of claim 1, wherein two rows of contacts are disposed within the housing to provide electrical contact with both sides of the daughter board, the second row of contacts providing a second linear array of contacts, the second linear array of contacts being converted into a second area array on the circuit board.

4. The electrical connector of claim 1, wherein the first connection points are contact pads disposed along a top surface of the circuit board for connecting with the contacts, the circuit board having circuit traces and vias to the bottom surface of the circuit board, further traces extend from the vias to second contact pads to receive the balls.

5. The electrical connector of claim 1, wherein mounting members are disposed along either side of the housing, the mounting members have stabilization feet to be received and secured against the mother board and a latch to secure the daughter board therein.

6. The electrical connector of claim 1, wherein the housing has two rows of contacts with a board receiving slot disposed therebetween, the board receiving-slot accepting the daughter board at an angle for insertion, the two rows of contacts providing electrical connection to both sides of the daughter board.

7. An electrical connector, comprising:

a housing having a plurality of contacts mounted therein to provide electrical connection from a daughter board to a circuit board, the contacts providing a linear array of first connection points to the circuit board;

the circuit board converts the linear array of first connection points to an area array of second connection points and the area array of second connection points are connected to a mother board by way of a ball grid array, whereby the housing provides an electrical connection between the daughter board and the mother board.

8. The electrical connector of claim 7, wherein the ball grid array comprises solder balls.

9. The electrical connector of claim 7, wherein two rows of contacts are disposed within the housing to provide electrical contact with both sides of the daughter board, the second row of contacts providing a second linear array of contacts, the second linear array of contacts being converted into a second area array on the circuit board.

10. The electrical connector of claim 7, wherein the first connection points are contact pads disposed along a top surface of the circuit board for connecting with the contacts, the circuit board having circuit traces and vias to the bottom surface of the circuit board, further traces extend from the vias to second contact pads to receive the balls.

11. The electrical connector of claim 7, wherein mounting members are disposed along either side of the housing, the mounting members have stabilization feet to be received and secured against the mother board and a latch to secure the daughter board therein.

12. The electrical connector of claim 7, wherein the housing has two rows of contacts with a board receiving slot disposed therebetween, the board receiving slot accepting the daughter board at an angle for insertion, the two rows of contacts providing electrical connection to both sides of the daughter board.

13. An electrical connector comprising a housing having a linear array of electrical contacts disposed therein, the contacts each having first contact sections to provide electrical connection to a daughter board and second contact sections to provide electrical connection to a circuit board, the second contact sections being disposed in a linear array on the circuit board, the circuit board having traces to convert the linear array to an area array of connection sections, the area array of connection sections being electrically connected to a mother board by way of a ball grid array.

14. The electrical connector of claim 13, wherein the ball grid array comprises solder balls.

15. The electrical connector of claim 13, wherein two rows of contacts are disposed within the housing to provide electrical contact with both sides of the daughter board, the second row of contacts providing a second linear array of contacts, the second linear array of contacts being converted into a second area array on the circuit board.

16. The electrical connector of claim 13, wherein the first contact sections are contact pads disposed along a top surface of the circuit board for connecting with the contacts, the circuit board having circuit traces and vias to the bottom surface of the circuit board, further traces extend from the vias to second contact pads to receive the balls.

17. The electrical connector of claim 13, wherein mounting members are disposed along either side of the housing, the mounting members have stabilization feet to be received and secured against the mother board and a latch to secure the daughter board therein.

18. The electrical connector of claim 13, wherein the housing has two rows of contacts with a board receiving slot disposed therebetween, the board receiving slot accepting the daughter board at an angle for insertion, the two rows of contacts providing electrical connection to both sides of the daughter board.

* * * * *